United States Patent
Hayashi et al.

(10) Patent No.: US 7,429,762 B2
(45) Date of Patent: Sep. 30, 2008

(54) SEMICONDUCTOR DEVICE AND METHOD OF FABRICATING THE SAME

(75) Inventors: Katsumasa Hayashi, Mie (JP); Toshiyuki Kondo, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 11/030,099

(22) Filed: Jan. 7, 2005

(65) Prior Publication Data

US 2005/0180198 A1 Aug. 18, 2005

(30) Foreign Application Priority Data

Jan. 9, 2004 (JP) .............................. 2004-004100

(51) Int. Cl.
*H01L 29/40* (2006.01)
(52) U.S. Cl. ...................... 257/204; 257/621
(58) Field of Classification Search ................ 257/204, 257/621
See application file for complete search history.

(56) References Cited

U.S. PATENT DOCUMENTS

| 5,311,070 | A | * | 5/1994 | Dooley | 327/208 |
| 5,631,863 | A | * | 5/1997 | Fechner et al. | 365/156 |
| 6,180,984 | B1 | * | 1/2001 | Golke et al. | 257/347 |
| 6,271,568 | B1 | * | 8/2001 | Woodruff et al. | 257/379 |
| 6,529,401 | B2 | | 3/2003 | Nii | |
| 6,700,166 | B2 | | 3/2004 | Yoshizawa | |

* cited by examiner

*Primary Examiner*—Douglas M Menz
(74) *Attorney, Agent, or Firm*—Oblon, Spivak, McClelland, Maier & Neustadt, P.C.

(57) ABSTRACT

A semiconductor device includes a semiconductor substrate, first and second CMOS inverter circuits formed on the semiconductor substrate and constituting an SRAM memory cell, each inverter circuit having input and output terminals, and first and second resistance elements formed in the semiconductor substrate and having respective one ends connected to a gate electrode pattern serving as input terminals of the first and second CMOS inverter circuits and the respective other ends connected to electrodes serving as output terminals of the first and second CMOS inverter circuits. The gate electrode pattern includes an underside on which a gate insulation film is formed, the gate insulation film being located between the semiconductor substrate and the gate electrode pattern and having an opening. The first and second resistance elements include respective portions adjacent to the gate electrode pattern, at which portions the first and second resistance elements are electrically connected via the opening to the gate electrode pattern located over the opening.

6 Claims, 12 Drawing Sheets

US 7,429,762 B2

SEMICONDUCTOR DEVICE AND METHOD OF FABRICATING THE SAME

CROSS-REFERENCE TO RELATED APPLICATION

This application claims priority to Japanese patent application No. 2004-4100, the content of which is incorporated herein by reference.

BACKGROUND OF THE INVENTION

1. Field of the Invention

The present invention relates to a semiconductor device comprising an SRAM memory cell having two CMOS inverter circuits and serving as a memory device and a method of fabricating the same.

2. Description of the Related Art

A semiconductor device called "full CMOS static random access memory (SRAM)" comprises a plurality of memory cells each of which is composed of six MOS transistors. Arrangement patterns of point symmetry type, linear symmetry type and the like have been suggested for each memory cell. Occurrence of failure called "soft error" is recently at issue in SRAM's. In the soft error, externally incident neutron beam or αbeam changes the stored contents. The soft error has been found to be reduced by inserting a resistor or capacitor to a node of the SRAM memory cell circuit.

For example, U.S. Pat. No. 6,529,401 discloses an SRAM to which the aforementioned countermeasure is applied. In the disclosed countermeasure, a resistor is added to a node. Generally, an operating speed of the semiconductor device tends to be reduced when a resistor with a high resistance value is added to a node. However, since a higher priority is given to a reduction in power consumption rather than an operating speed in SRAM's of lower power consumption type, the aforesaid countermeasure can be sufficient.

In the countermeasure disclosed in aforementioned U.S. Pat. No. 6,529,401, a film is made from a material having a higher resistance value than cobalt silicide (CoSi), for example, tungsten (W) and patterned in order that a resistor with a high resistance value may be added to a node. In this case, the tungsten film is provided as a resistor electrically connected to the node. Consequently, the resistor has a higher resistance than silicide formed by a salicide process and accordingly, the aforesaid is an outstanding arrangement as a countermeasure against soft error. However, the aforesaid conventional arrangement requires an additional fabrication process of forming a tungsten film, thus increasing the number of processes. Consequently, the conventional arrangement increases the costs, it is difficult to employ actually.

BRIEF SUMMARY OF THE INVENTION

Therefore, an object of the present invention is to provide a semiconductor device having an SRAM memory cell using the conventional type of CMOS inverter, in which device a countermeasure against the soft error can be applied by adding a resistor with a high resistance value to a node in a simple arrangement without a large change in the fabrication process, and a method of fabricating the semiconductor device.

The present invention provides a semiconductor device comprising a semiconductor substrate, first and second CMOS inverter circuits formed on the semiconductor substrate and constituting an SRAM memory cell, each inverter circuit having input and output terminals, and first and second resistance elements formed in the semiconductor substrate and having respective one ends connected to a gate electrode pattern serving as input terminals of the first and second CMOS inverter circuits and the respective other ends connected to electrodes serving as output terminals of the first and second CMOS inverter circuits. The gate electrode pattern includes an underside on which a gate insulation film is formed, the gate insulation film being located between the semiconductor substrate and the gate electrode pattern and having an opening. The first and second resistance elements include respective portions adjacent to the gate electrode pattern, at which portions the first and second resistance elements are electrically connected via the opening to the gate electrode pattern located over the opening.

BRIEF DESCRIPTION OF THE DRAWINGS

Other objects, features and advantages of the present invention will become clear upon review of the following detailed description of the invention, with reference to the accompanying drawings, in which.

DETAILED DESCRIPTION OF THE INVENTION

Figure 1:
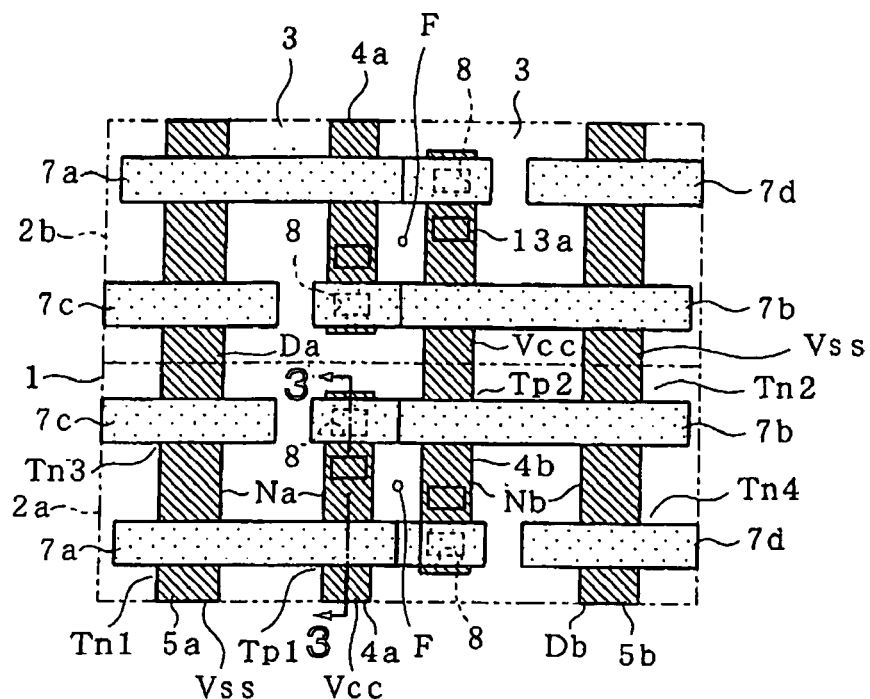
FIG. 1 is a plan view of two juxtaposed SRAM memory cells showing a first embodiment in accordance with the present invention.
Figure 2:
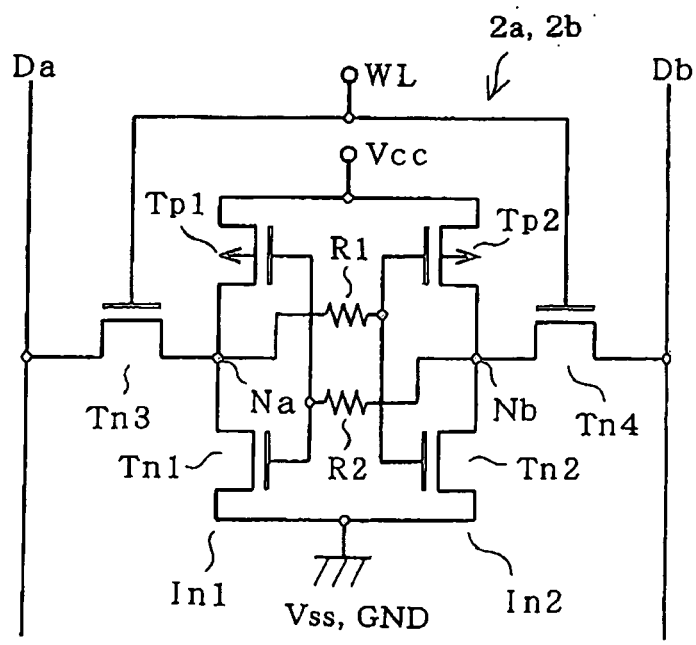
FIG. 2 is an electrical circuit diagram of each SRAM memory cell.

A first embodiment of the present invention will be described with reference to FIGS. 1 to 6D. FIG. 1 shows two SRAM memory cells 2a and 2b formed adjacent to a principal face side of a semiconductor substrate 1. A gate electrode is formed in the figure. FIG. 2 shows an electrical arrangement of the SRAM memory cell 2a or 2b.

The electrical arrangement of the SRAM memory cell will first be described in brief. Referring to FIG. 2, the SRAM memory cell 2a is of a general full CMOS type and comprises six metal oxide semiconductor field effect transistors (MOSFET's). Each MOSFET will hereinafter be referred to as "transistor." The six transistors include two p-channel transistors Tp1 and Tp2 and four n-channel transistors Tn1 to Tn4. The transistors Tp1 and Tn1 constitute an inverter circuit In1, whereas the transistors Tp2 and Tn2 constitute an inverter circuit In2. The inverters In1 and In2 are connected between power supply terminals $V_{cc}$ and $V_{ss}$. The power supply terminal $V_{ss}$ is substantially a ground (GND) terminal.

An n-channel transistor Tn3 has a source/drain terminal connected between a data line Da and an output terminal Na (node) of the inverter circuit In1. Also, an n-channel transistor Tn4 has a source/drain terminal connected between a data line Db and an output terminal Nb (node) of the inverter circuit In2. The transistors Tn3 and Tn4 have respective gate terminals connected to a word line WL. Further, the inverter circuit In1 has an output terminal Na connected via a resistor R1 serving as a resistance element to a gate terminal which is common to the transistors Tp2 and Tn2 and is an input terminal of the inverter circuit In2. The inverter circuit In2 has an output terminal Nb connected via a resistor R2 serving as a resistance element to a gate terminal which is common to the transistors Tp1 and Tn1 and is an input terminal of the inverter circuit In1. The SRAM memory cell 2 can reduce a soft error by the operation of the resistors R1 and R2.

An entire arrangement of the SRAM memory cells 2a and 2b will now be described with reference to FIG. 1. Although two SRAM memory cells are shown in FIG. 1 for the purpose of simplification, the actual semiconductor device includes a number of SRAM memory cells arranged on a chip so that a predetermined number of groups of SRAM memory cells corresponding to a storage capacity are in linear symmetry with each other. In the following description, the SRAM memory cell 2a will be exemplified.

The SRAM memory cell 2a comprises a semiconductor substrate 1 which is a silicon substrate and an element forming region longitudinally divided by the shallow trench isolation (STI) 3 buried in the semiconductor substrate 1 as an isolated region. N-wells 4a and 4b are formed in the element forming region so as to correspond to the transistors Tp1 and Tp2 which are p-channel MOSFET's. P-wells 5a and 5b are formed so as to correspond to the transistors Tn1 to Tn4 which are n-channel MOSFET's. A gate oxide film (not shown) serving as a gate insulating film is formed on upper surfaces of the n-wells 4a and 4b and p-wells 5a and 5b. Gate electrode patterns 7a to 7d each of which comprises a polycrystalline silicon are formed so as to be perpendicular to a direction in which the wells are formed on the gate oxide film. Source and drain regions are formed in a region located between gate electrode patterns 7a to 7d of wells 4a, 4b, 5a and 5b, whereby the aforementioned transistors Tp1, Tp2 and Tn1 to Tn4 are formed.

More specifically, the transistor Tp1 is formed at a portion where the gate electrode pattern 7a intersects the n-well 4a, whereas the transistor Tn1 is formed at a portion where the gate electrode 7a intersects the p-well 5a. Further, the transistor Tp2 is formed at a portion where the gate electrode pattern 7b intersects the n-well 4b, whereas the transistor Tn2 is formed at a portion where the gate electrode 7b intersects the p-well 5b. Still further, the transistor Tn3 is formed at a portion where the gate electrode pattern 7c intersects the p-well 5a, whereas the transistor Tn4 is formed at a portion where the gate electrode pattern 7d intersects the p-well 5b. By the above-described arrangement, each of the SRAM memory cells 2a and 2b is formed so as to be in point symmetry about point F where diagonal lines thereof intersect each other.

In the aforementioned arrangement, resistance elements are formed at the portions where the gate electrode patterns 7b and 7a intersect the n-wells 4a and 4b with the interior of the semiconductor substrate 1 serving as an energizing path, respectively. In a conventional arrangement, a shared contact structure is employed in each of these portions. In the shared contact structure, the gate electrode pattern 7b and n-well 4a are short-circuited thereby to be electrically connected to each other. However, the embodiment employs a direct contact system in which the gate electrode pattern 7b is directly connected to the semiconductor substrate 1.

Figure 3:
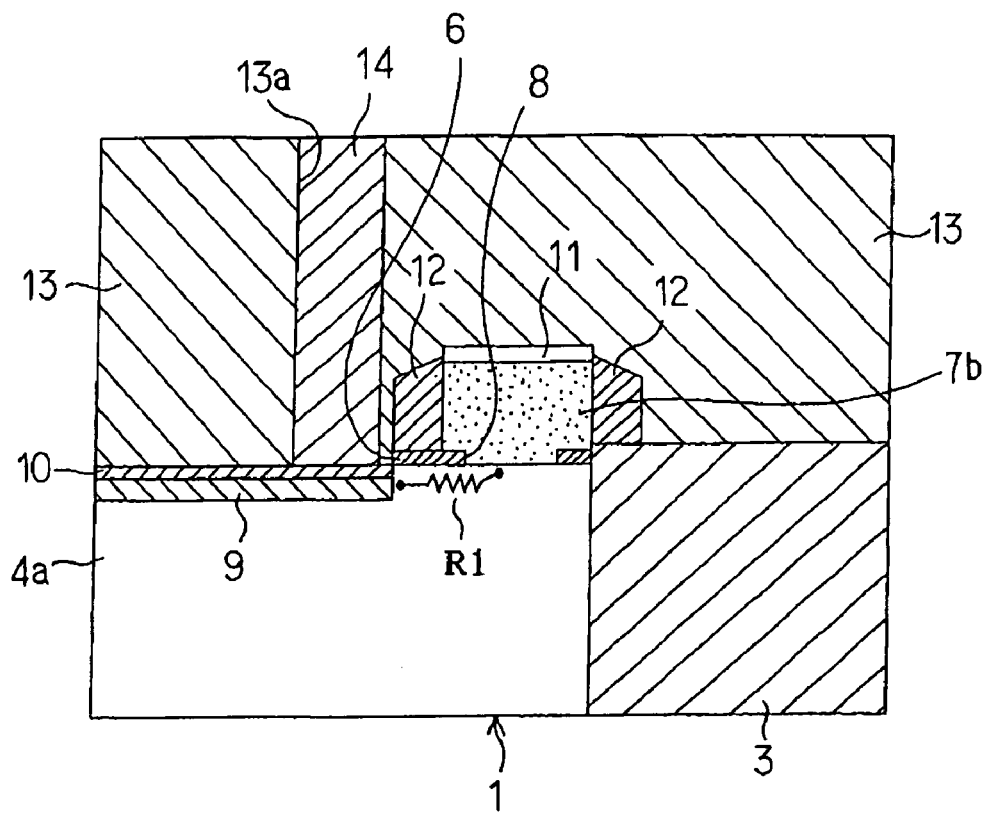
FIG. 3 is a sectional view of a resistance-element forming part taken along line 3-3 in FIG. 1.
Figure 4:
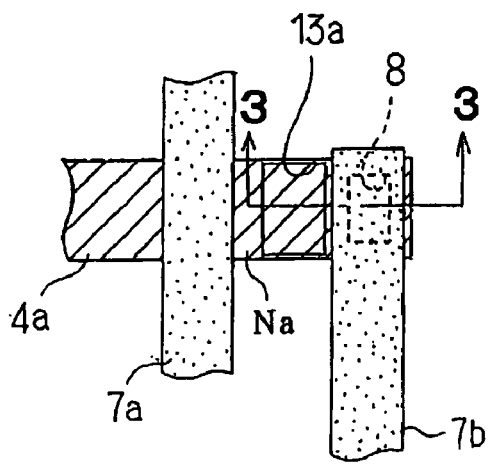
FIG. 4 is a plan view of the resistance-element forming part.

FIG. 3 is a schematic section taken along line 3-3 in each of FIGS. 1 and 4 and shows an arrangement in which the resistor R1 is provided, which arrangement is a characteristic of the invention. FIG. 4 is a plan view of the major part corresponding to the arrangement shown in FIG. 3. In FIGS. 3 and 4, the gate oxide film 6 is formed on the underside of the gate electrode pattern 7b on the upper side of the semiconductor substrate 1. An opening 8 for direct contact is formed in a portion where the resistor R1 is to be formed.

A p-type region 9 doped with p-type impurity and serving as a source/drain region is formed in a portion corresponding to the n-well 4a. Silicide films 10 and 11 are formed on an upper layer of the p-type region 9 and an upper side of the gate electrode pattern 7b by the salicide process respectively. Further, spacers 12 are formed on both sides of the gate electrode pattern 7b by an ordinary spacer forming process.

An interlayer insulation film 13 is formed over an entire surface of the above-described arrangement, and a contact opening 13a is formed for electrical connection of a node Na. A tungsten (W) plug 14 is buried in the opening 13a. As the result of employment of the above-described arrangement, the gate electrode pattern 7b is electrically connected via the opening 8 of the gate oxide film 6 to the n-well 4a and further via the n-well 4a of the semiconductor substrate 1 to the source/drain region 9, whereby the gate electrode pattern 7b is connected with the resistor R1 being interposed.

Figure 5A:
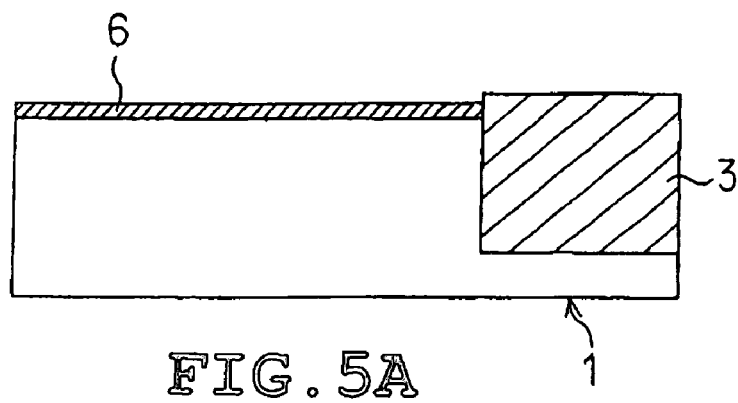
FIGS. 5A to 5F are schematic sections of the resistance-element forming part.
Figure 5B:
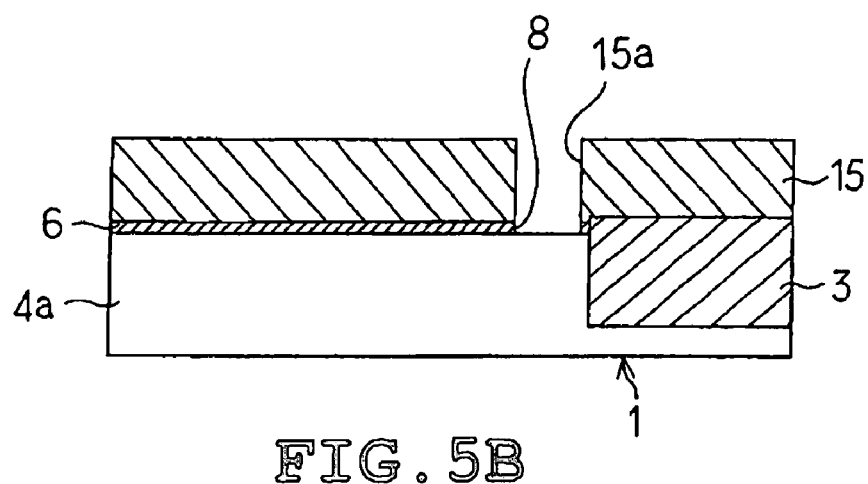

A process for fabricating the above-arranged SRAM memory cell 2a will be described with reference to FIGS. 5A to 7B. These figures mainly show the provision of the resistors R1 and R2 serving as resistance elements. Accordingly, a process for forming the structure of the resistors R1 and R2 will hereinafter be described in detail. Firstly, an active area (AA) pattern is formed on the semiconductor substrate 1 as an element forming region as shown in FIG. 5A. An insulating film is buried in a shallow trench formed as an isolation region thereby to be formed into an STI 3. An impurity ion is then implanted so that the n-wells 4a and 4b, p-wells 5a and 5b and channel region are formed. Subsequently, the gate oxide film 6 is formed by a thermal oxidation process or the like so as to have a predetermined film thickness.

Subsequently, a contact hole or the opening 8 is formed in the surface of the gate oxide film 6 by the photolithography process. In this case, a photoresist 15 is applied to the gate oxide film 6 and STI 3 and an opening pattern 15a is formed. The gate oxide film 6 is removed with the opening pattern 15a serving as an etching mask by the dry or wet etching process, whereby the opening 8 is formed. The pattern of opening 8 is shown by broken line in FIG. 1.

Figure 5C:
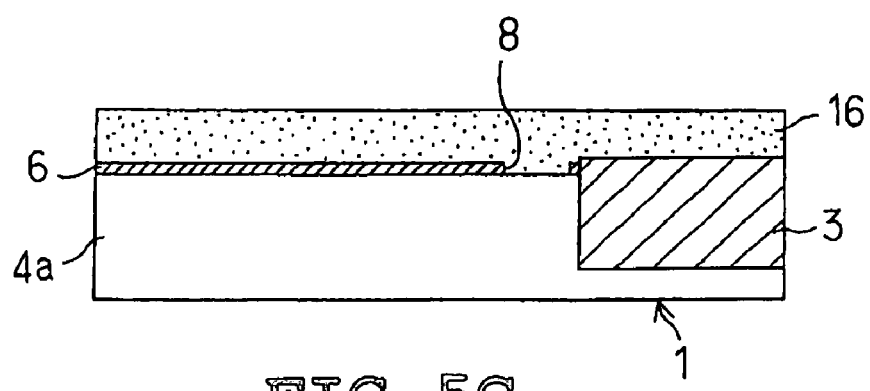
Figure 5D:
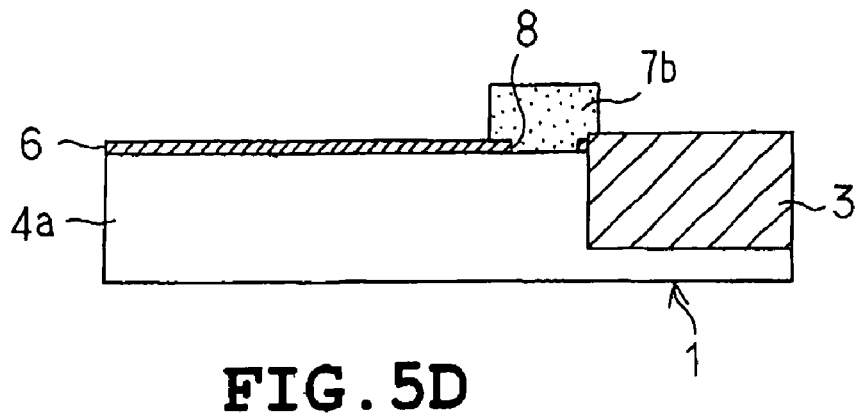

Subsequently, as shown in FIG. 5C, a polycrystalline silicon film 16 for formation of the gate electrode is deposited on the entire surface by the chemical vapor deposition (CVD) process. Subsequently, as shown in FIG. 5D, a photoresist is applied to the surface of the polycrystalline silicon film 16, thereby being formed into a photoresist film. The photoresist film is then patterned so that the portion other than the gate electrode patterns 7a to 7d (pattern 7b in the figure) is opened. The polycrystalline silicon film 16 is patterned with the patterned photoresist film serving as an etching mask by the dry etching process such as the reactive ion etching (RIE), whereupon the gate electrode patterns 7a to 7d are formed.

Figure 5E:
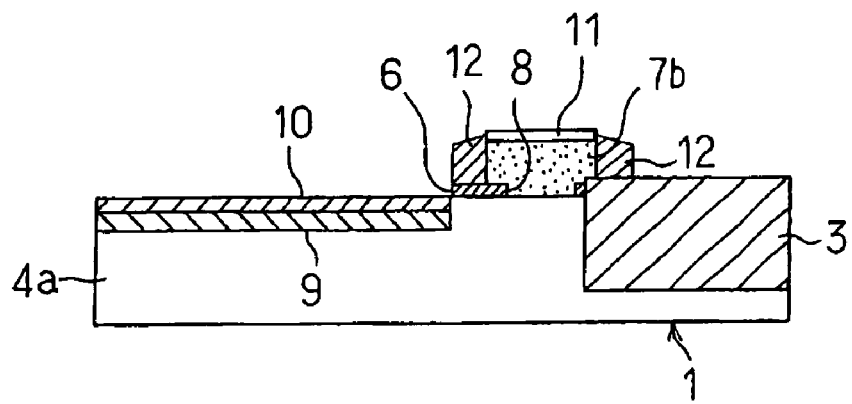

Subsequently, as shown in FIG. 5E, a step of forming an ordinary spacer 12 is carried out and then, the source/drain region 9 is formed. In this step, the gate insulation film 6 is opened by the photolithography process and then doped with impurity by the ion implanting process. Subsequently, a salicide process for reduction in the wire resistance is carried out to form silicides 10 and 11, if necessary.

Figure 5F:
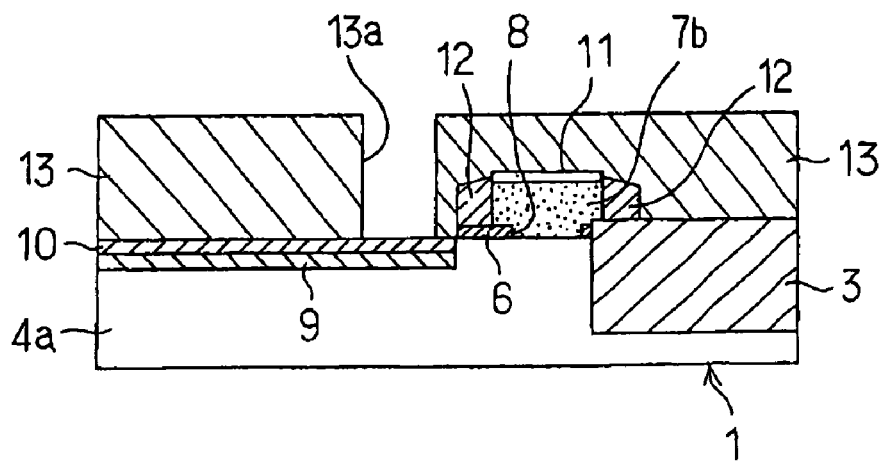

Subsequently, as shown in FIG. 5F, the interlayer insulation film 13 is deposited on the entire upper side by the CVD process, and the upper side of he interlayer insulation film 13 is flattened by the ordinary chemical mechanical polishing (CMP). A photoresist is applied to the surface of the interlayer insulation film 13 to be formed into a photoresist film. The interlayer insulation film 13 is etched with the photoresist mask serving as an etching mask, whereby the contact hole 13a is formed. At this time, the contact hole 13a of the node Na is rendered large enough to be connectable to only the source/drain region 9 of the semiconductor substrate 1 and is formed so as to be open at a position where it is adjacent to the gate electrode pattern 7b. Accordingly, the shared contact structure is not employed in the embodiment.

Figure 6A:
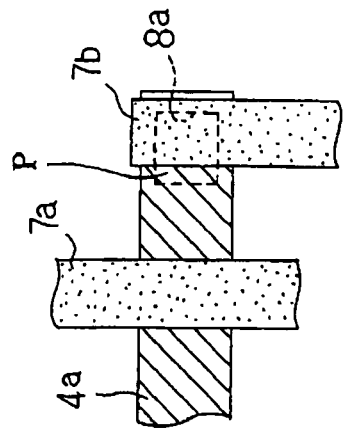
FIGS. 6A to 6D are plan views and sectional views, showing the case of displacement of an opening formed in the gate oxide film.

Further, the opening 8 of the gate oxide film 6 has a width set so as to be smaller than that of the gate electrode pattern 7b as shown in FIG. 6A. The reason for this setting is that the semiconductor substrate 1 will be adversely affected or damaged, for example, in a subsequent process when a mask pattern is displaced in the photolithography process. In this case, when the opening 8 is regarded as a single element, the misalignment of the opening 8 in the direction of arrow S in FIG. 6A seems to be taken into consideration as that of the mask pattern. Actually, however, another opening 8 adjacent to a symmetrical position results in misalignment in the opposite direction as shown in FIG. 1. This positional relation imposes restriction on the formation of the opening 8. Accordingly, the width of the opening 8 is rendered smaller than that of the gate electrode pattern 7d as described above. An allowable range of the misalignment in the position is defined by the difference between the widths of the opening 8 and gate electrode pattern 7d.

Figure 6B:
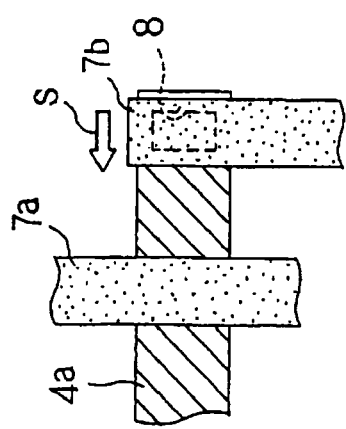
Figure 6C:
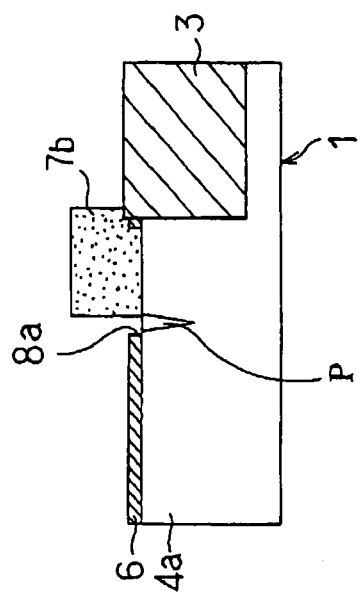
Figure 6D:
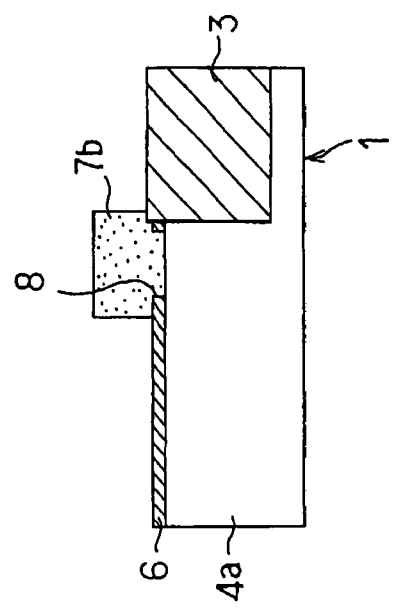

More specifically, for example, assume now the case where the mask pattern is not misaligned. FIGS. 6A and 6C show a normal state, for example. The following inconvenience results from the case where the opening 8 has a width as large as the gate electrode pattern 7d as shown in FIGS. 6B and 6D. If the mask pattern is misaligned to one side, one of the openings 8 adjacent to each other is misaligned as shown in FIGS. 6B and 6D. Subsequently, a process of forming a polycrystalline silicon film is carried out so that a polycrystalline silicon film 16 which will serve as the gate electrode pattern 7b is formed as shown in FIG. 5C. Thereafter, the polycrystalline silicon film 16 is etched by the photolithography to be patterned as shown in FIG. 5D. In this case, the gate oxide film is formed as shown in FIG. 6D in which the surface of the gate electrode film is exposed by the etching of the polycrystalline silicon film 16 but not in FIG. 6C, the surface of the semiconductor substrate 1 is also exposed at a portion P where the mask pattern is misaligned. Since the exposed surface of the semiconductor substrate 1 is also made of the same silicon material, it is etched, too. The width of the opening 8 is set in order that this failure may be prevented.

In the foregoing embodiment, the gate electrode patterns 7a and 7b are connected through the inside of the semiconductor substrate 1 to each other by the direct contact method when the resistance elements are formed at the nodes of the SRAM memory cells 2a and 2b, whereupon the resistors R1 and R2 are provided. Consequently, the arrangement of countermeasure against soft error can be realized easily at low costs without formation of separate resistance layers.

Figure 7A:
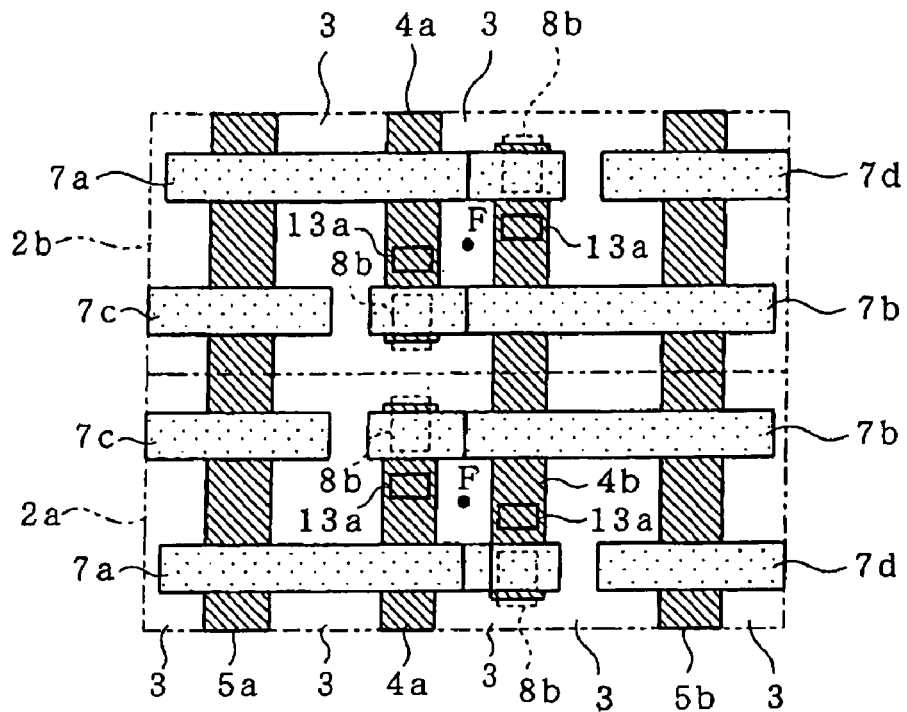
FIGS. 7A and 7B are views similar to FIG. 1, showing a second embodiment in accordance with the invention.
Figure 7B:
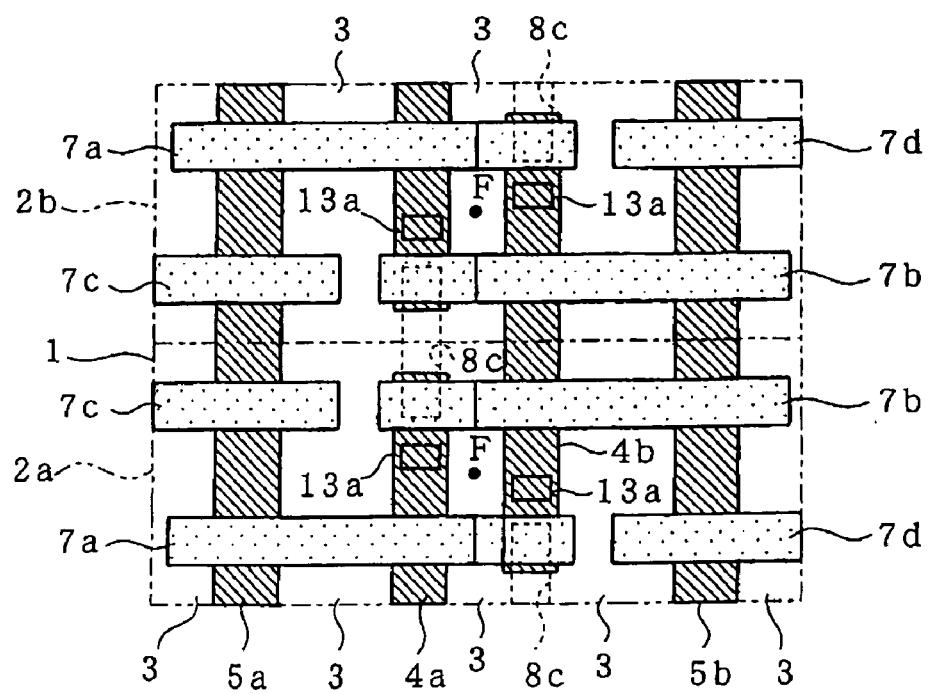

FIGS. 7A and 7B illustrate a second embodiment of the invention. The second embodiment differs from the first embodiment in that an opening 8b or 8c is formed instead of the opening 8 of the gate electrode film 6. More specifically, in FIG. 7A, out of the opening forming portions of the SRAM memory cells 2a and 2b, the opening 8b is formed so as to become wider at the side of the SRAM memory cells adjacent to each other with the STI region 3 being defined therebetween. Consequently, even when the mask pattern is misaligned in the photolithography process, the opening can be formed in the STI region 3 of each opening 8b without being reversely affected by the displacement of the mask pattern.

Further, in FIG. 7B, opening forming portions adjacent to each other with the STI region 3 being defined therebetween are joined to each other into a rectangular opening 8c. Thus, since the opening 8c has a large area, the patterning performance in the photolithography process can be improved.

A part of the opening 8b or the joined part of the opening 8c is located in the STI region 3. Accordingly, the part is etched in the etching of the gate electrode film 6. However, the opening 8b or 8c is not adversely affected substantially. In other words, even upon occurrence of misalignment of the mask, the arrangement of countermeasure against soft error can be realized in the second embodiment with the same accuracy in the misalignment as in the first embodiment.

Figure 8A:
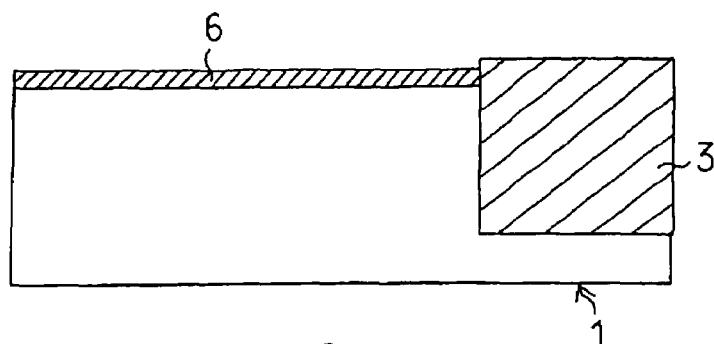
FIGS. 8A to 8H are schematic sectional views of the resistance-element forming part in a third embodiment in accordance with the invention, showing stages of the fabrication process.
Figure 8B:
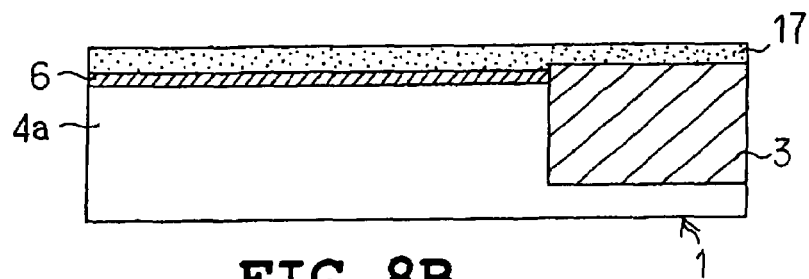

FIGS. 8A to 8H illustrate a third embodiment of the invention. Differing form the first embodiment, the third embodiment employs a process of forming in two divided stages the polycrystalline silicon film 16 for formation of the gate electrode patterns 7a to 7d. More specifically, in FIG. 8A, the element forming region is patterned on the semiconductor substrate 1 so that the STI region 3 is formed in the same manner as described above. After the gate electrode film 6 has been formed, the same polycrystalline silicon film 17 as used for forming the gate electrode patterns 7a to 7d is formed so as to have a small film thickness as shown in FIG. 8B. The reason for this is that the gate oxide film 6 is prevented from being directly exposed to the processing atmosphere during the forming process. Thus, the polycrystalline silicon film 17 has the function of a protective film.

Figure 8C:
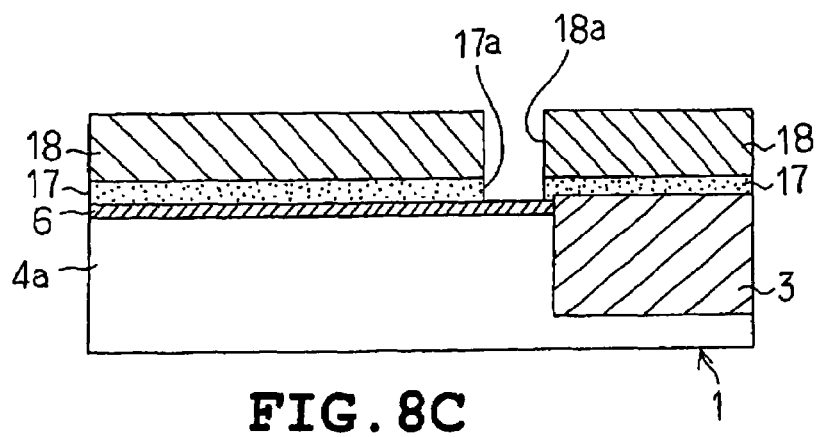
Figure 8D:
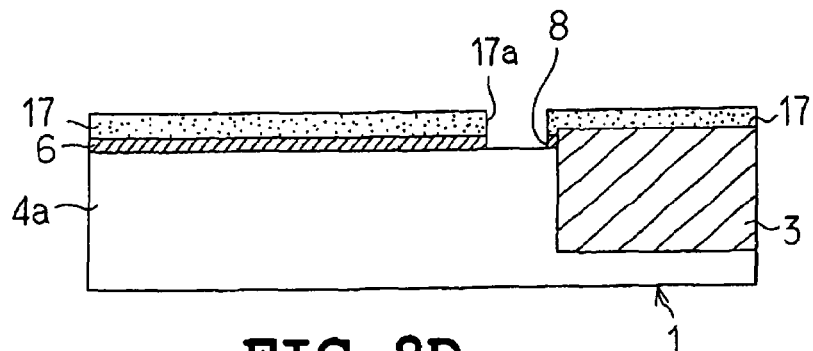

Subsequently, in the process of forming the opening 8 of the gate oxide film 6, the photoresist 18 is applied so that the opening pattern 18a is formed as shown in FIG. 8C. The polycrystalline silicon film 17 is dry-etched with the opening pattern 18a serving as an etching mask, whereby the opening 17a formed. Subsequently, the gate oxide film 6 is removed by the dry or wet etching so that the opening 8 is formed, as shown in FIG. 8D. The photoresist 18 is successively removed.

Figure 8E:
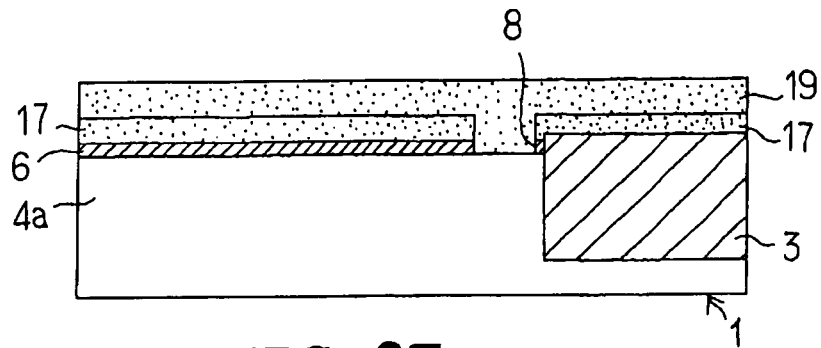
Figure 8F:
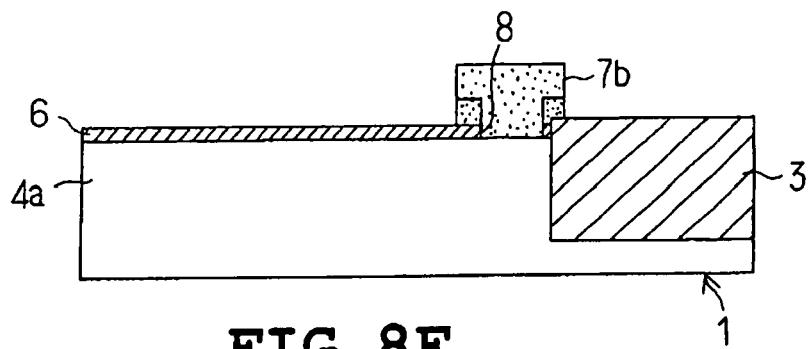
Figure 8G:
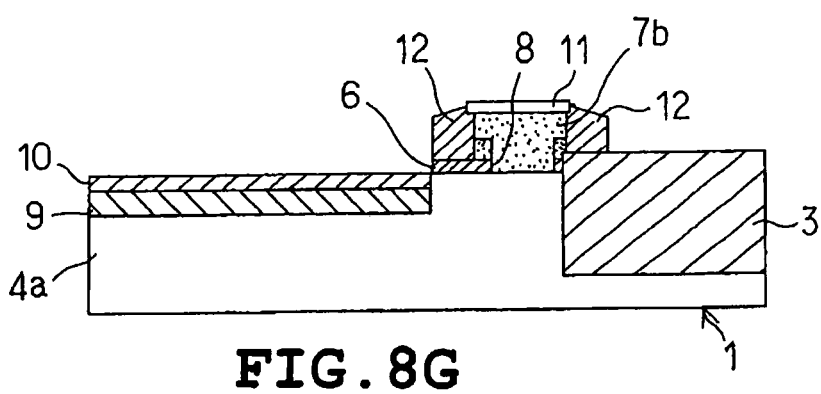
Figure 8H:
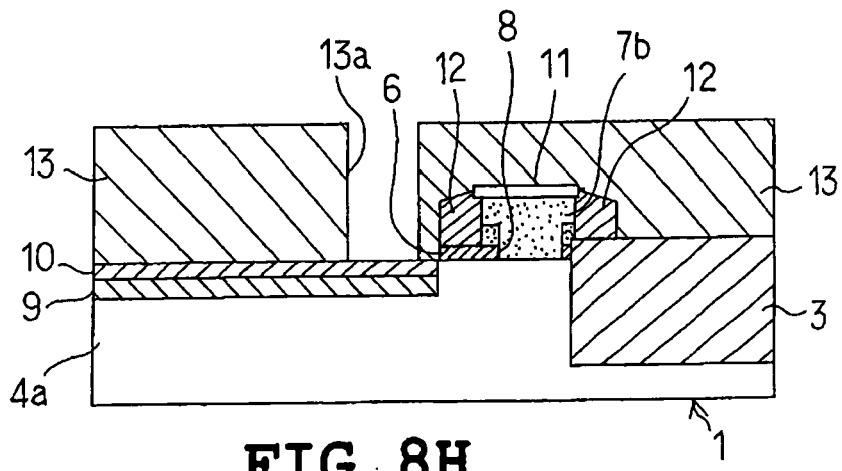

Subsequently, as shown in FIG. 8E, the polycrystalline silicon film 19 for forming the gate electrode is formed on the entire upper side of the polycrystalline silicon film 17 and in the opening 8 and etched by the photolithography process, as shown in FIG. 8E. The gate electrode patterns 7a to 7d are patterned as shown in FIG. 8F. As a result, the gate electrode patterns 7a to 7d can be formed in the same manner as in the first embodiment. Processing subsequent to the processes shown in FIGS. 8G and 8H is carried out in the same manner as in the first embodiment.

The same effect can be achieved from the third embodiment as from the first embodiment. Additionally, when the gate oxide film 6 is desired to be prevented from being exposed to the processing atmosphere during the forming process, it can be protected by the polycrystal line silicon film 17. Consequently, the gate oxide film 6 with an electrically stable characteristic can be ensured and accordingly, the reliability can be improved.

Figure 9:
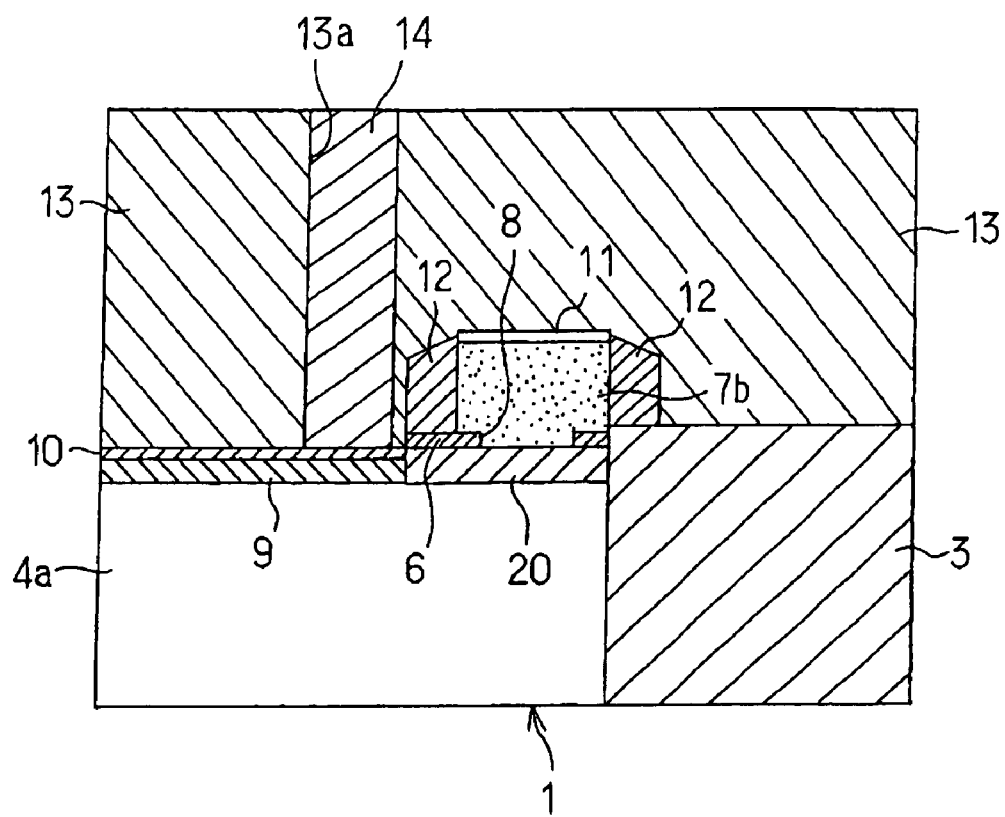
FIG. 9 is a view similar to FIG. 3, showing a fourth embodiment in accordance with the invention.
Figure 10A:
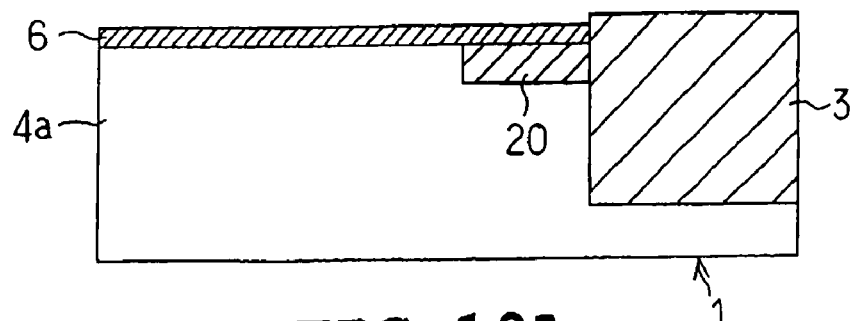
FIGS. 10A to 10F are schematic sectional views of the resistance-element forming part, showing stages of the fabrication process.
Figure 10B:
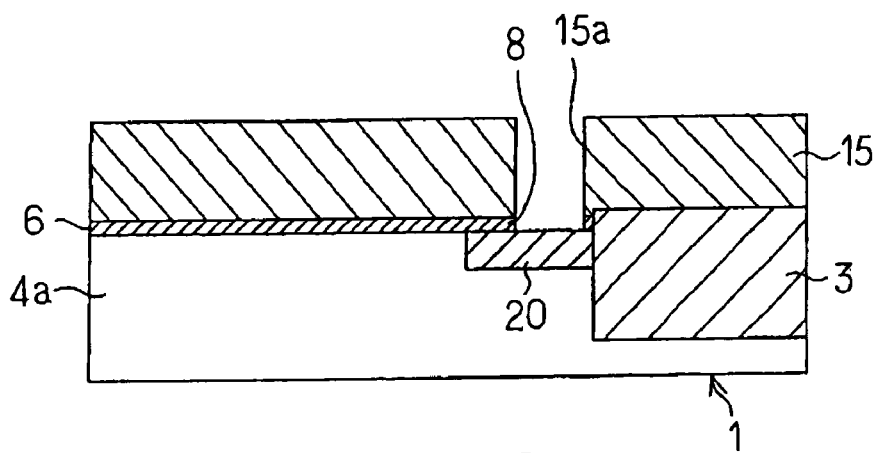
Figure 10C:
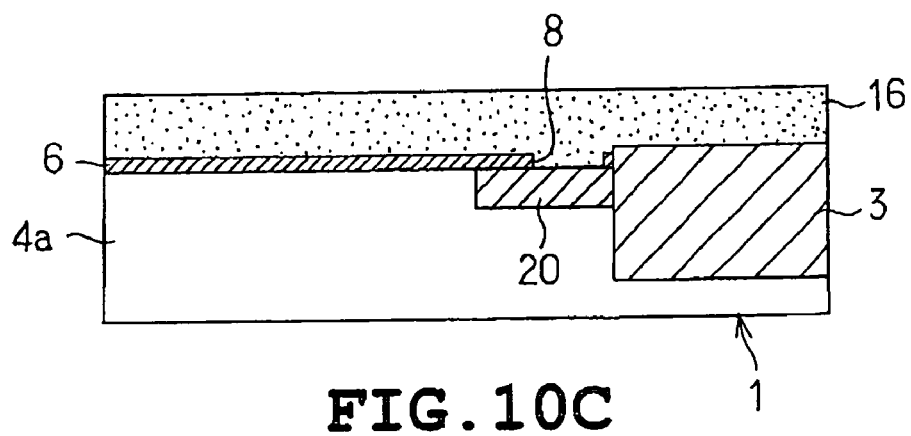
Figure 10D:
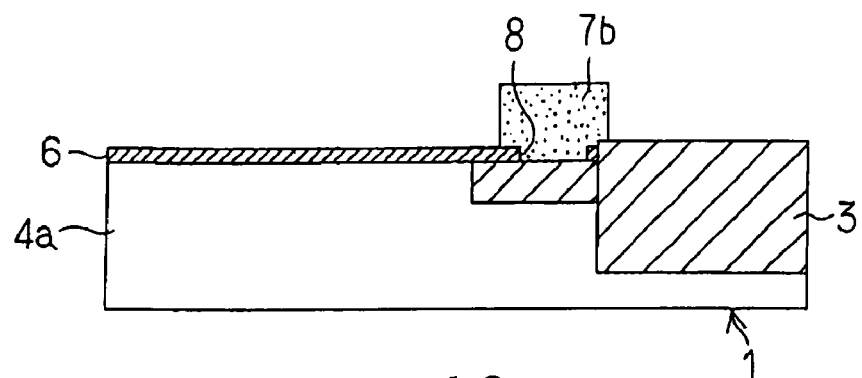
Figure 10E:
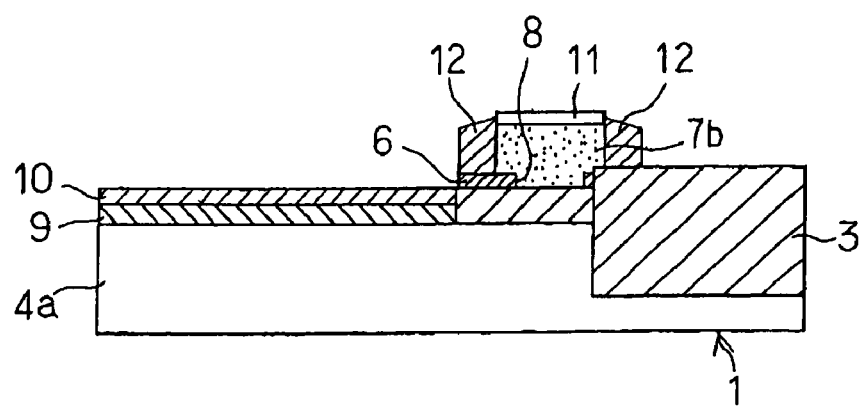
Figure 10F:
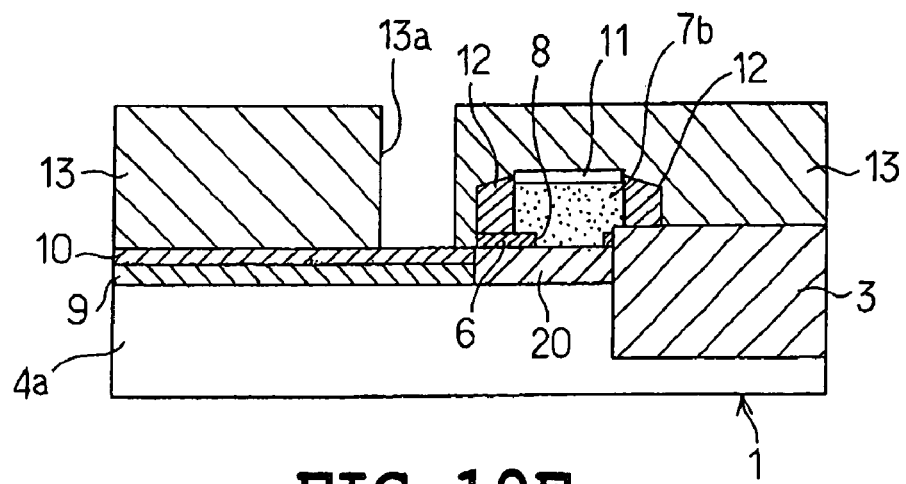

FIGS. 9 to 10F illustrate a fourth embodiment of the invention. The fourth embodiment differs from the first embodiment in that the impurity diffusion region 20 doped with impurity is formed in the forming portion of the resistor R1.

As shown in FIG. 9, when the gate electrode pattern 7b is caused to be brought via the opening 8 of the gate oxide film 6 into contact with the semiconductor substrate 1, an unsuitable electrical connection renders the operation of the semiconductor device unstable since the source/drain region 9 is not formed on the surface of the semiconductor substrate 1 side. In the fourth embodiment, the impurity diffusion region 20 is previously formed in the fabrication process in order that the operation of the semiconductor device may be prevented from becoming unstable.

In the fabrication process, impurity is doped by ion implantation into a part corresponding to the impurity diffusion region 20 after the process of dividing the element forming region by the STI region 3, as shown in FIG. 10A. Thus, the photoresist film with an ion implantation region opened by an ordinal photolithography process is patterned so that the ion implantation can be carried out through the opening. In this case, an amount of ion implantation is set in a range which is required for electrical connection and in which the resistance values of the resistors R1 and R2 take respective predetermined values. Subsequently, as shown in FIGS. 10B to 10F, the same processes as those in the first embodiment are carried out such that the SRAM memory cells 2a and 2b as shown in FIG. 9 can be obtained.

In the fourth embodiment, too, the same effect can be achieved from the fourth embodiment as from the first embodiment. Further, the electrical connection can be rendered reliable between the gate electrode pattern 7b and semiconductor substrate 1. Still further, the electrical characteristic of the semiconductor device can be rendered stabilized by adjusting the resistance values of resistors R1 and R2.

Figure 11:
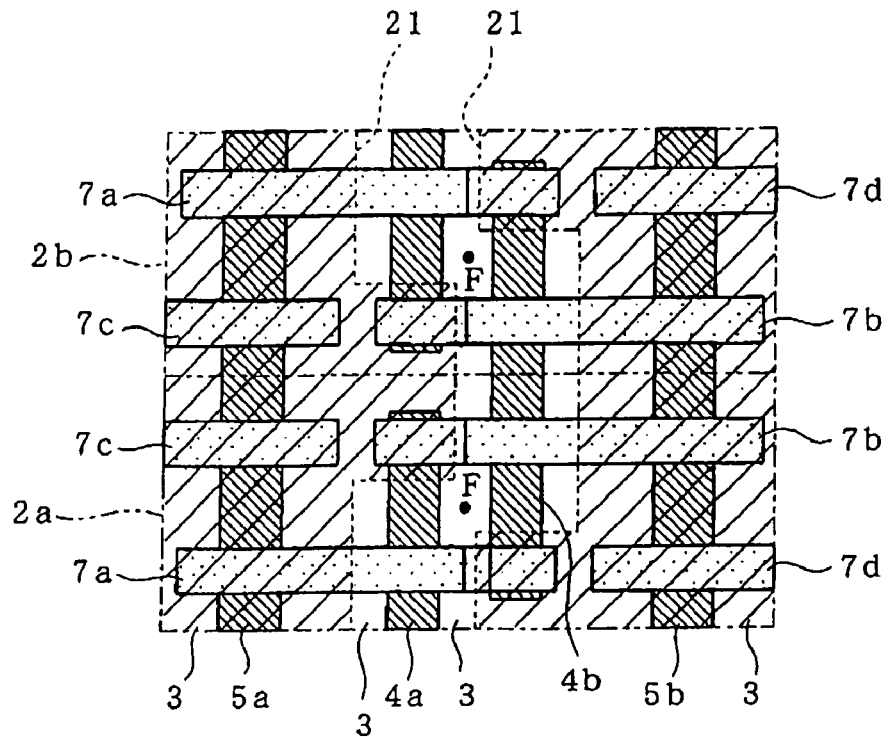
FIG. 11 illustrates a pattern for forming a source/drain diffusion region in a fifth embodiment in accordance with the invention.
Figure 12:
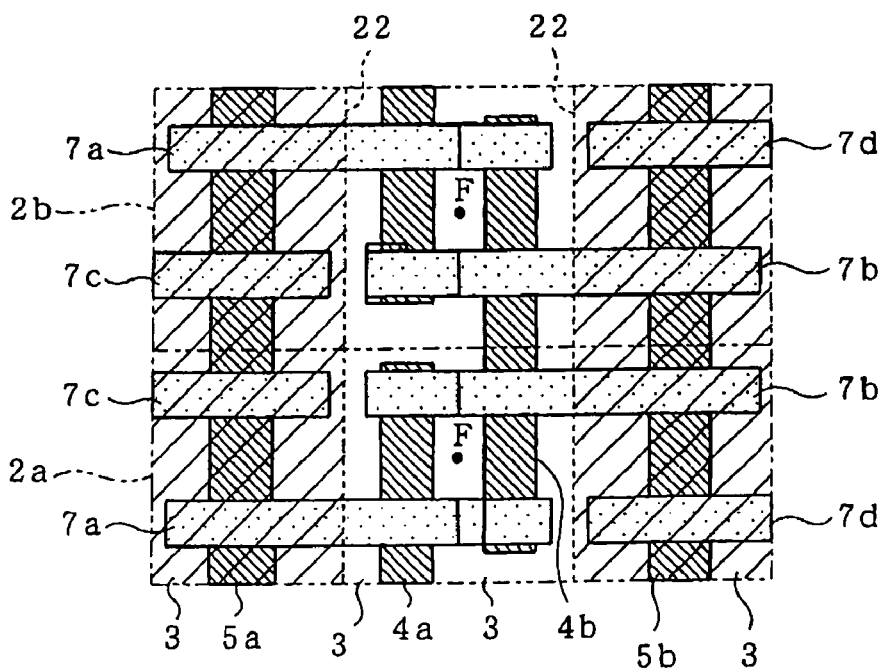
FIG. 12 illustrates an ordinary pattern for forming a source/drain region for the purpose of comparison.

FIGS. 11 and 12 illustrate a fifth embodiment of the invention. The fifth embodiment differs from the foregoing embodiments in that a mask pattern at the time of ion implantation is changed in the process of forming the source/drain region 9 so that impurity is not introduced to the portions of the gate electrode patterns 7a and 7b forming the respective resistors R1 and R2, whereby high resistivity is achieved.

In the normal process in each of the foregoing embodiments, the source/drain region 9 is formed after formation of the gate electrode patterns 7a to 7d. The mask pattern of the ion implantation during formation of the source/drain region 9 has a self-alignment structure. Accordingly, no impurity is deposited beneath the gate electrode patterns 7a to 7d nor spacer 12. Further, although impurity is deposited on the gate electrode patterns 7a to 7d by the ion implantation, the impurity does not adversely affect the electrical characteristic of the semiconductor device. Accordingly, ion implantation is carried out on the surfaces of gate electrode patterns 7a and 7b with respect to the portions where nodes Na and Nb are formed, namely, the portions where the resistors R1 and R2 are formed in each of the foregoing embodiments respectively.

Accordingly, the pattern as shown in FIG. 12 is employed as the mask pattern in the formation of the source/drain region 9. In FIG. 12, a slash region 22 designates a photoresist pattern for which ion implantation is not carried out. Thus, when the source/drain regions 9 of the p-channel transistors Tp1 and Tp2 are formed, the mask pattern is set to the shape of a linear strip including the gate electrode patterns 7a and 7b.

On the other hand, the mask pattern is designed so that a photoresist pattern 21 is formed so as to cover the corresponding gate electrode patterns 7a and 7b when high resistivity is achieved without deposition of impurity also in the gate electrode patterns 7a and 7b as adjustment of resistance values of resistors R1 and R2. As a result, since impurity is not deposited on the portions where the resistors R1 and R2 of the gate electrode patterns 7a and 7b are to be formed respectively, high resistivity can be ensured. Consequently, use of the high resistivity process together with each of the above-described countermeasures of the respective embodiments can solve the case where required resistance value cannot be obtained as the countermeasure against soft error with respect to the resistors R1 and R2.

The invention should not be limited to the foregoing embodiments but may be modified or expanded as follows. Each of the foregoing embodiments constitutes an element technique independent from each other. Accordingly, a desired object can be achieved by applying the element techniques in combination. For example, the first and second embodiments may be combined to each other, or the first and third embodiments may be combined to each other. Alternatively, all the embodiments may be combined together. As a result, the resistance elements can be formed on the nodes at low costs while a stable fabrication process is ensured.

The invention is applied to the SRAM memory cell of the point symmetry type in the foregoing embodiments. However, the invention may be applied to an SRAM memory cell of the linear symmetry type or SRAM memory cells of other types. Further, the invention may be applied to the arrangement used together with a capacitor.

Regarding the region where the resistance elements are formed, a pattern such as the resistors R1 and R2 is set in the foregoing embodiments. However, when there is enough room in design of the STI region 3, gate electrode patterns 7a and 7b or the like, a separate pattern for formation of a resistance element may be set. Consequently, the adjustment of resistance value can be rendered more stable and a high reliable process can be employed.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate;
   first and second CMOS inverter circuits formed on the semiconductor substrate and constituting an SRAM memory cell, each inverter circuit having input and output terminals; and
   first and second resistance elements formed in the semiconductor substrate and having respective one ends connected to a gate electrode pattern serving as input terminals of the first and second CMOS inverter circuits and the respective other ends connected to electrodes serving as output terminals of the first and second CMOS inverter circuits,
   wherein the gate electrode pattern includes an underside on which a gate insulation film is formed, the gate insulation film being located between the semiconductor substrate and the gate electrode pattern and having an opening, and the first and second resistance elements include respective portions adjacent to the gate electrode pattern, at which portions the first and second resistance elements are electrically connected via the opening to the gate electrode pattern located over the opening.

2. The semiconductor device according to claim 1, wherein the opening is formed so as to be connected to another opening to be formed adjacently thereto with an element isolation region being located therebetween.

3. The semiconductor device according to claim 1, wherein the SRAM memory cell is formed so that both components of the first and second CMOS inverter circuits and the first and second resistance elements are in a point symmetry on the semiconductor substrate.

4. The semiconductor device according to claim 2, wherein the SRAM memory cell is formed so that both components of the first and second CMOS inverter circuits and the first and second resistance elements are in a point symmetry on the semiconductor substrate.

5. The semiconductor device according to claim 1, further comprising an impurity density adjusting region formed in a region of the semiconductor substrate where the resistance element is formed.

6. The semiconductor device according to claim 2, further comprising an impurity density adjusting region formed in a region of the semiconductor substrate where the resistance element is formed.

* * * * *